(12) United States Patent
Kaczynski

(10) Patent No.: US 7,813,711 B1
(45) Date of Patent: Oct. 12, 2010

(54) STACKING BASEBAND CIRCUITS USING DEEP N-WELL AND INCREASED SUPPLY VOLTAGE

(75) Inventor: Brian J. Kaczynski, Santa Clara, CA (US)

(73) Assignee: Atheros Communications, Inc., San Jose, CA (US)

( * ) Notice: Subject to any disclaimer, the term of this patent is extended or adjusted under 35 U.S.C. 154(b) by 865 days.

(21) Appl. No.: 11/688,810

(22) Filed: Mar. 20, 2007

(51) Int. Cl.
*H04B 1/28* (2006.01)
(52) U.S. Cl. .................... 455/333; 455/343.1; 438/227; 438/228
(58) Field of Classification Search .................. 455/333, 455/341, 343.1, 343.5; 363/60, 63; 438/227, 438/228, 252, 527; 257/288, 500, 369, 371
See application file for complete search history.

(56) References Cited

U.S. PATENT DOCUMENTS

| | | | | |
|---|---|---|---|---|
| 6,418,040 B1 * | 7/2002 | Meng | ........................... | 363/60 |
| 6,501,325 B1 * | 12/2002 | Meng | ........................... | 327/536 |
| 6,633,073 B2 * | 10/2003 | Rezvani et al. | ............... | 257/504 |
| 6,773,992 B2 * | 8/2004 | Doi | ........................... | 438/266 |
| 7,199,431 B2 * | 4/2007 | Lee et al. | ..................... | 257/371 |

\* cited by examiner

*Primary Examiner*—Sonny Trinh
(74) *Attorney, Agent, or Firm*—Bever, Hoffman & Harms, LLP; Jeanette S. Harms

(57) ABSTRACT

A method of designing stacked circuits for an integrated circuit is described. In this method, a plurality of devices that are stackable may be determined. Some of those devices, i.e. a subset of stackable devices, may be formed in a deep n-well, thereby allowing that subset of stackable devices to receive an increased supply voltage. The remainder of the stackable devices may be formed in a standard n-well, thereby allowing such devices to receive a standard supply voltage. In one embodiment, the standard supply voltage may be VDD and the increased supply voltage may be 2×VDD. This method may be advantageously used in both the design of stacked circuits for and the implementation of stacked circuits in an integrated circuit.

20 Claims, 5 Drawing Sheets

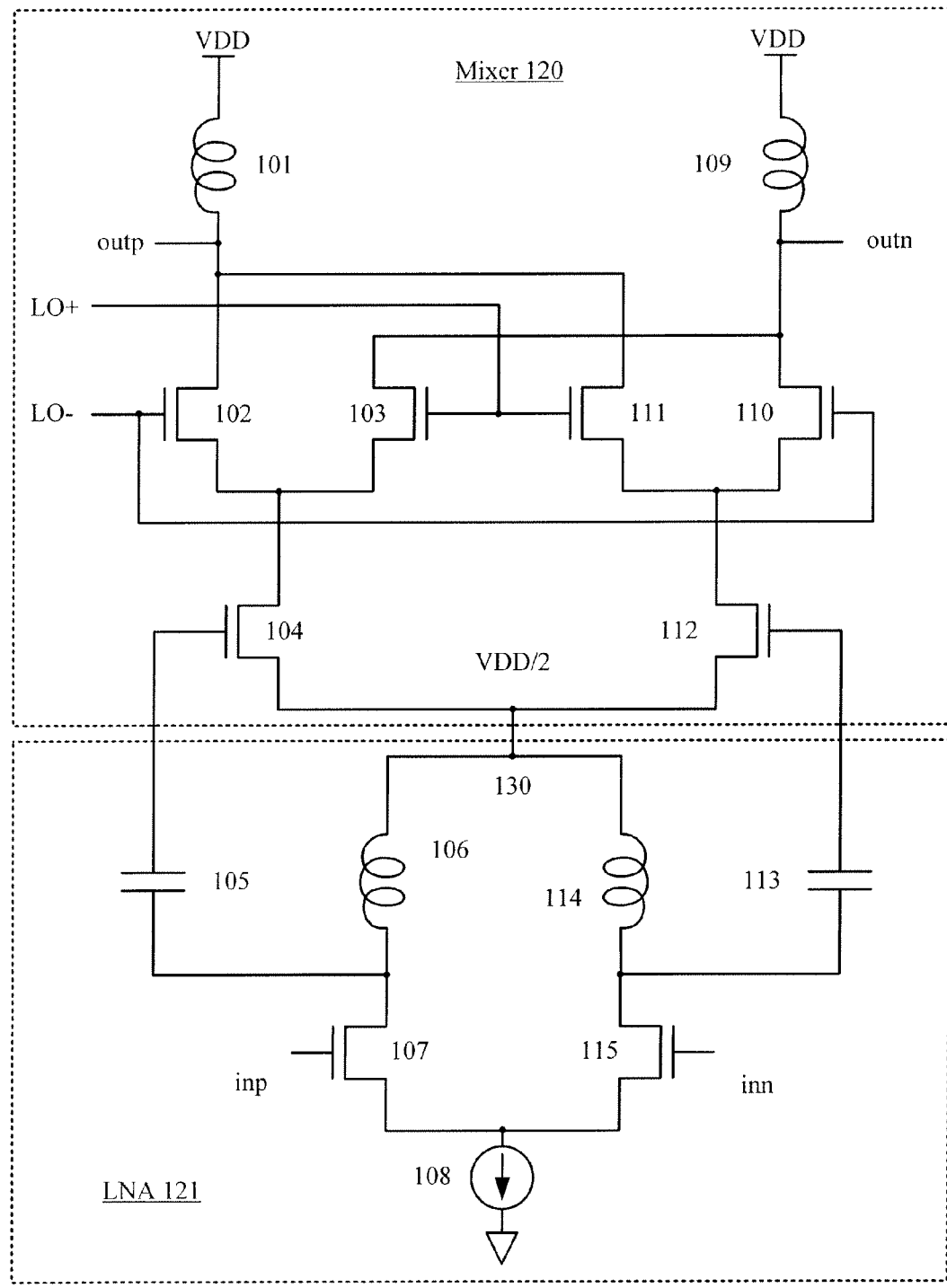
Figure 1: Prior Art

STACKING BASEBAND CIRCUITS USING DEEP N-WELL AND INCREASED SUPPLY VOLTAGE

BACKGROUND OF THE INVENTION

1. Field of the Invention

The present invention relates to baseband circuits and a technique for reducing power in such baseband circuits, especially when a linear regulator is used.

2. Related Art

Stacked devices are well-known in radio frequency (RF) circuits, wherein "stacked" devices are defined as devices that share the same current. For example, FIG. 1 illustrates known stacked RF circuits including a mixer 120 and a low noise amplifier (LNA) 121. LNA 121 receives a differential input signal, i.e. inp and inn, on the gates of transistors 107 and 115, respectively. Note that in this embodiment, the transistors in LNA 121 and mixer 120 are NMOS transistors.

In this embodiment of LNA 121, the sources of transistors 107 and 115 are coupled to a current source 108, which in turn is connected to ground. An inductor 106 is connected between the drain of transistor 107 and an intermediate voltage node 130. Similarly, an inductor 114 is connected between the drain of transistor 115 and intermediate voltage node 130. Capacitors 105 and 113 are respectively connected to the drains of transistors 107 and 115.

In this embodiment of mixer 120, the gates of transistors 104 and 112 are connected to capacitor 105 and 113, respectively. A transistor 104, a transistor 102, and an inductor 101 are connected in series between intermediate voltage node 130 and a voltage supply VDD. Similarly, a transistor 112, a transistor 110, and an inductor 109 are connected in series between intermediate voltage node 130 and the voltage supply VDD. Transistors 102 and 110 receive a negative local oscillator signal (LO−) on their gates. A transistor 103 is connected between the drain of transistor 104 and the drain of transistor 110. A transistor 111 is connected between the drain of transistor 112 and the drain of transistor 102. The gates of transistors 103 and 111 both receive a positive LO signal (LO+). In this embodiment, the outputs outp and outn of mixer 120 are provided at the drains of transistors 102 and 110.

In FIG. 1, the three transistors 102, 104, and 107, for example, may be easily stacked using a VDD voltage of 1.8 V. However, as devices in these RF circuits become smaller, the supply voltage must be decreased to minimize the possibility of device (i.e. transistor) failure. Unfortunately, the efficiency of the regulator providing the supply voltage may suffer when the output voltage decreases. Moreover, to have constant power with reduced voltage, current must be increased, thereby undesirably necessitating more chip area, e.g. trace area and/or device area.

SUMMARY OF THE INVENTION

A method of designing stacked circuits for an integrated circuit is described. In this method, a plurality of devices that are stackable may be determined. Some of those devices, i.e. a subset of stackable devices, may be formed in a deep n-well, thereby allowing that subset of stackable devices to receive an increased supply voltage. The remainder of the stackable devices may be formed in a standard n-well, thereby allowing such devices to receive a standard supply voltage. In one embodiment, the standard supply voltage may be VDD and the increased supply voltage may be 2×VDD. This method may be advantageously used in both the design of stacked circuits for and the implementation of stacked circuits in an integrated circuit.

In the case of a direct conversion receiver, the subset of stackable devices may be provided for a first path (e.g. a Q-path), whereas the remainder of the stackable devices may be provided for a second path (e.g. the I-path). In one embodiment, a linear regulator may be provided between the subset of stackable devices and the remainder of the stackable devices. In another embodiment, a set of level shifters may be provided in a digital portion of the first path.

Advantageously, the described stacking with deep n-well formation eliminates a low supply voltage/high current configuration and instead provides a higher supply voltage/lower current configuration. This higher supply voltage significantly improves the efficiency of a linear regulator providing the supply voltage. The lower current desirably reduces chip area. These and other advantages are described below in greater detail in the context of various embodiments of the invention.

BRIEF DESCRIPTION OF THE FIGURES

FIG. 1 illustrates known stacked RF circuits.

DETAILED DESCRIPTION OF THE FIGURES

Figure 2B:
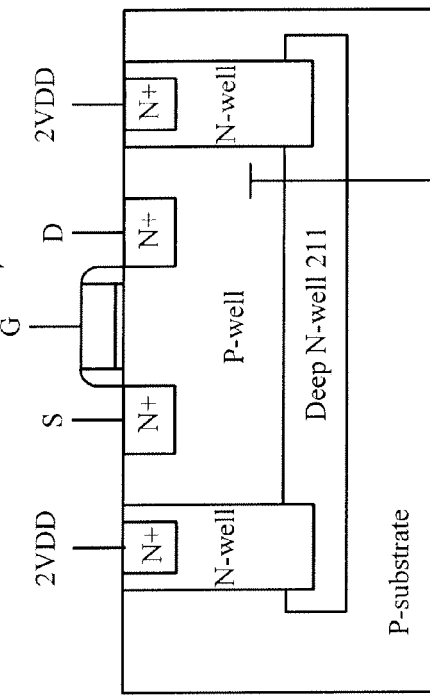
FIG. 2B illustrates an exemplary NMOS transistor formed in a deep n-well.
Figure 2C:
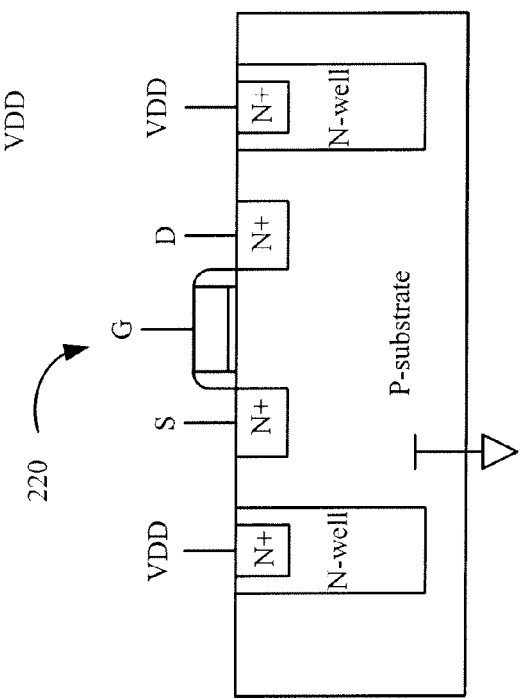
FIG. 2C illustrates an exemplary NMOS transistor formed in a standard n-well.
Figure 2A:
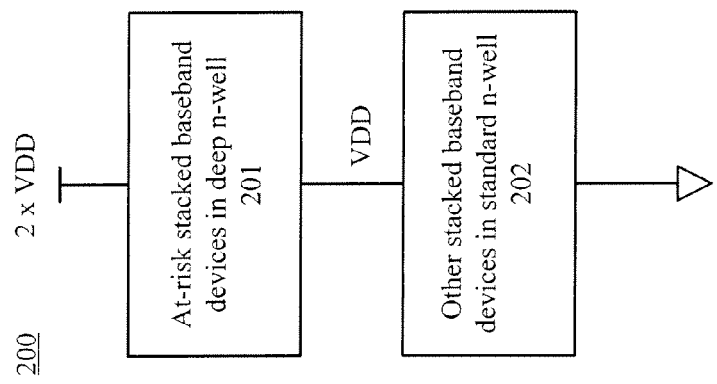
FIG. 2A illustrates a block diagram of a stacked integrated circuit design configuration.

FIG. 2A illustrates a block diagram of an integrated circuit design configuration 200 in accordance with the invention. In the embodiment shown in integrated circuit configuration 200, the supply voltage may be increased to 2×VDD, i.e. doubling a supply voltage. To protect stacked baseband devices 201 that could receive or be adversely affected by this increased supply voltage, referenced herein as the "at-risk stacked devices", baseband devices 201 may be formed in a deep n-well. The other baseband devices 202 in the integrated circuits, which receive the standard supply voltage VDD, may be formed in a standard n-well.

Forming the at-risk stacked devices in the deep n-well allows the bulk nodes of those devices to be connected to a non-ground voltage, e.g. VDD. That is, the deep n-well effectively isolates the device from the substrate, thereby allowing its bulk node to be connected to any non-ground voltage that is less than the supply voltage. FIG. 2B illustrates an exemplary NMOS transistor 210 formed in a deep n-well 211. FIG. 2C illustrates an exemplary NMOS transistor 220 formed in a standard n-well. Advantageously, forming deep n-well 210 may be easily included in a standard CMOS process with minimal, if any, additional cost.

Figure 3:
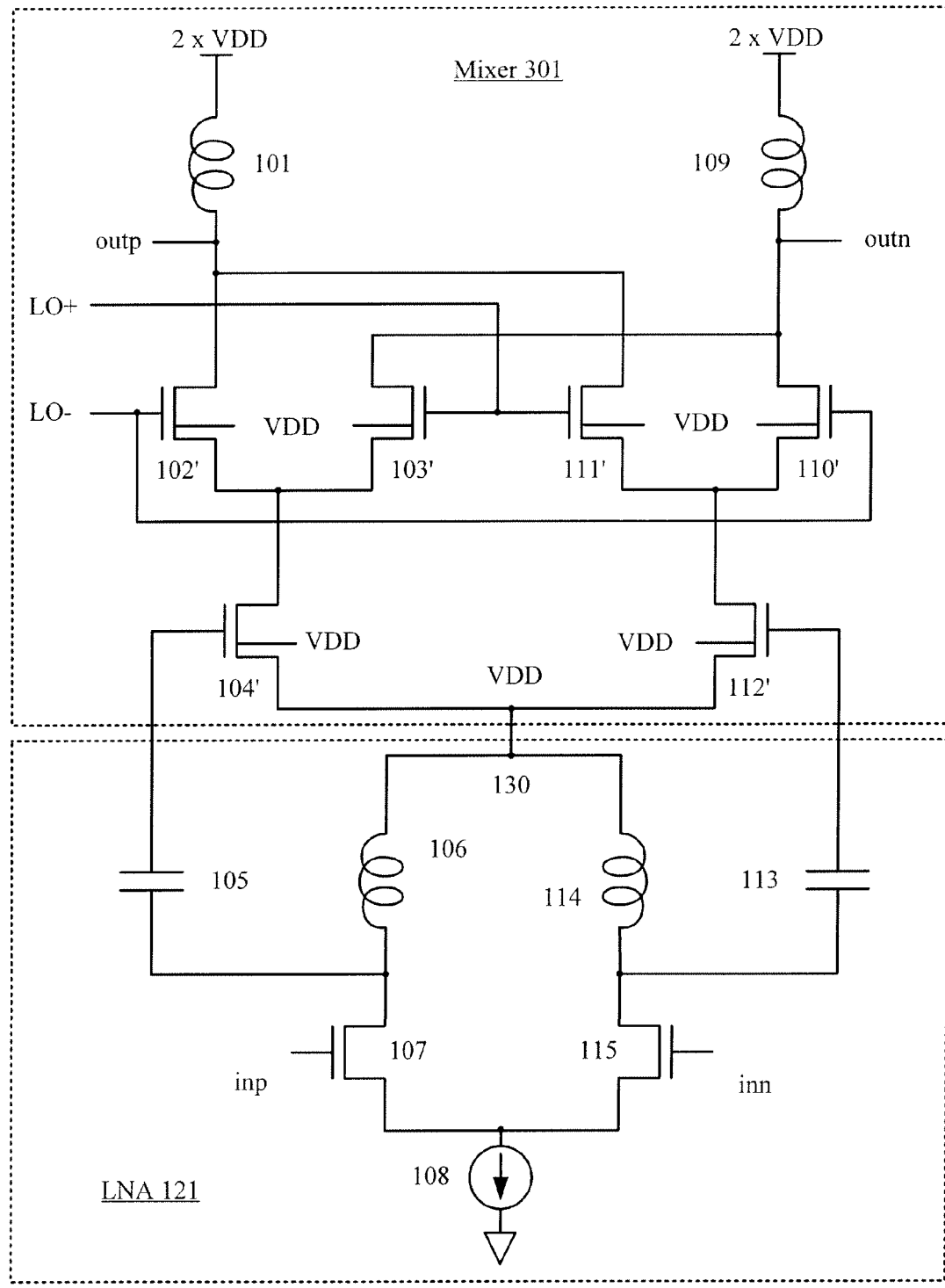
FIG. 3 illustrates stacked integrated circuits in which a subset of the devices may be formed in a deep n-well and a remainder of the devices may be formed in a standard n-well.

FIG. 3 illustrates stacked integrated circuits including a mixer 301 and low noise amplifier (LNA) 121 (noting that transistors and other components having a common numerical designation in FIGS. 1 and 3, e.g. transistors 102 and 102', have the same function in the circuits). In accordance with the present invention, mixer 301 may advantageously receive an increased supply voltage, e.g. 2×VDD, by forming at-risk stacked transistors 102', 103', 111', 110', 104', and 112' in a common deep n-well. Assuming that the increased supply voltage is 2×VDD, then the bulk nodes of transistors 102', 103', 111', 110', 104', and 112' may be connected to VDD.

Figure 4:
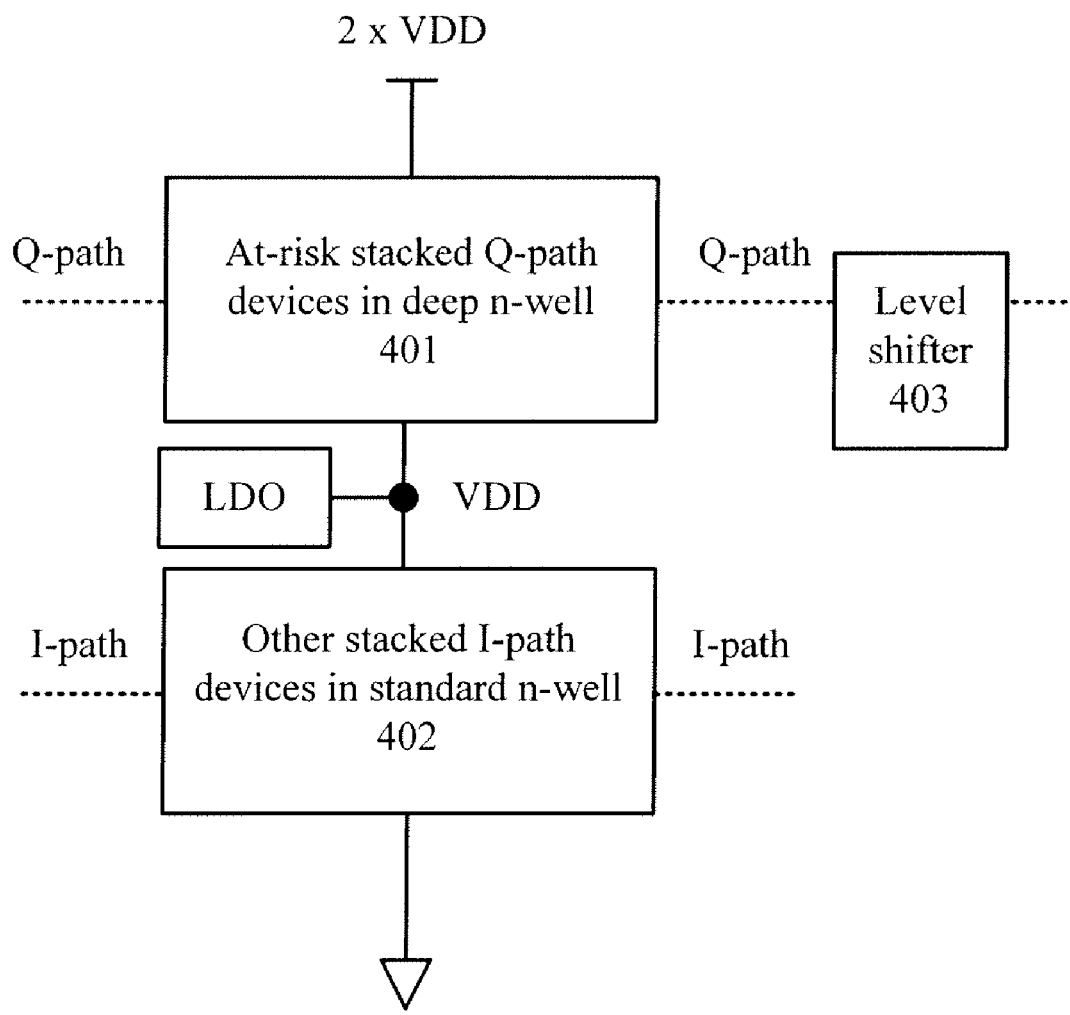
FIG. 4 illustrates a block diagram of another stacked integrated circuit design configuration.

Notably, this configuration may be applied to any set of devices that are stacked. For example, FIG. 4 illustrates a block diagram of an integrated circuit design configuration 400 that may be implemented in a direct conversion radio receiver in accordance with the invention. Note that a direct conversion radio receiver often includes both I and Q paths, wherein each path has identical components. In integrated circuit design configuration 400, the supply voltage may be increased to 2×VDD. In this embodiment, the Q-path devices may receive a supply voltage of 2×VDD, although the I-path devices could receive 2×VDD in other embodiments. Advantageously, to protect the Q-path devices, the "at-risk stacked Q-path devices" 401 may be formed in the deep n-well (with their bulk nodes connected to VDD). In this case, the stacked I-path devices 402 may be formed in a standard n-well (i.e. with their bulk nodes connected to ground).

In one embodiment, a linear regulator may be connected to a node that is between the Q-path devices 401 and the I-path devices 402 to keep VDD balanced at that point, i.e. to provide noise suppression and DC accuracy. This linear regulator will contribute some transient AC current, e.g. on the order of 1% of the total current.

Note that the I-path and the Q-path may include many analog components. Thus, the described stacking configuration may be used for any components duplicated in the I- and Q-paths, such as mixers, filters, amplifiers, and analog-to-digital converters (ADCs). Further note that when an analog signal is converted to a digital signal, a set of level shifters may be used to shift one of the path's signals accordingly, i.e. in the digital portion of the receiver, the I- and Q-paths should have the same ground. Thus, in the embodiment shown in FIG. 4, a set of level shifters 403 could be placed following the ADC on the Q-path.

Advantageously, the described stacking with deep n-well formation eliminates a low supply voltage/high current and instead provides a higher supply voltage/lower current. Notably, where a linear regulator is used to provide a supply voltage, the maximum efficiency is Vout/Vin. For example, if 3 V is being regulated down to 2 V, then 66% efficiency is the best efficiency that may be achieved. Similarly, if 3 V is being regulated down to 1 V, then 33% efficiency is the best efficiency that may be achieved. The described stacking with deep n-well formation advantageously allows a higher supply voltage to be used for Vout, thereby significantly improving the efficiency of that linear regulator.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

Figure 5:
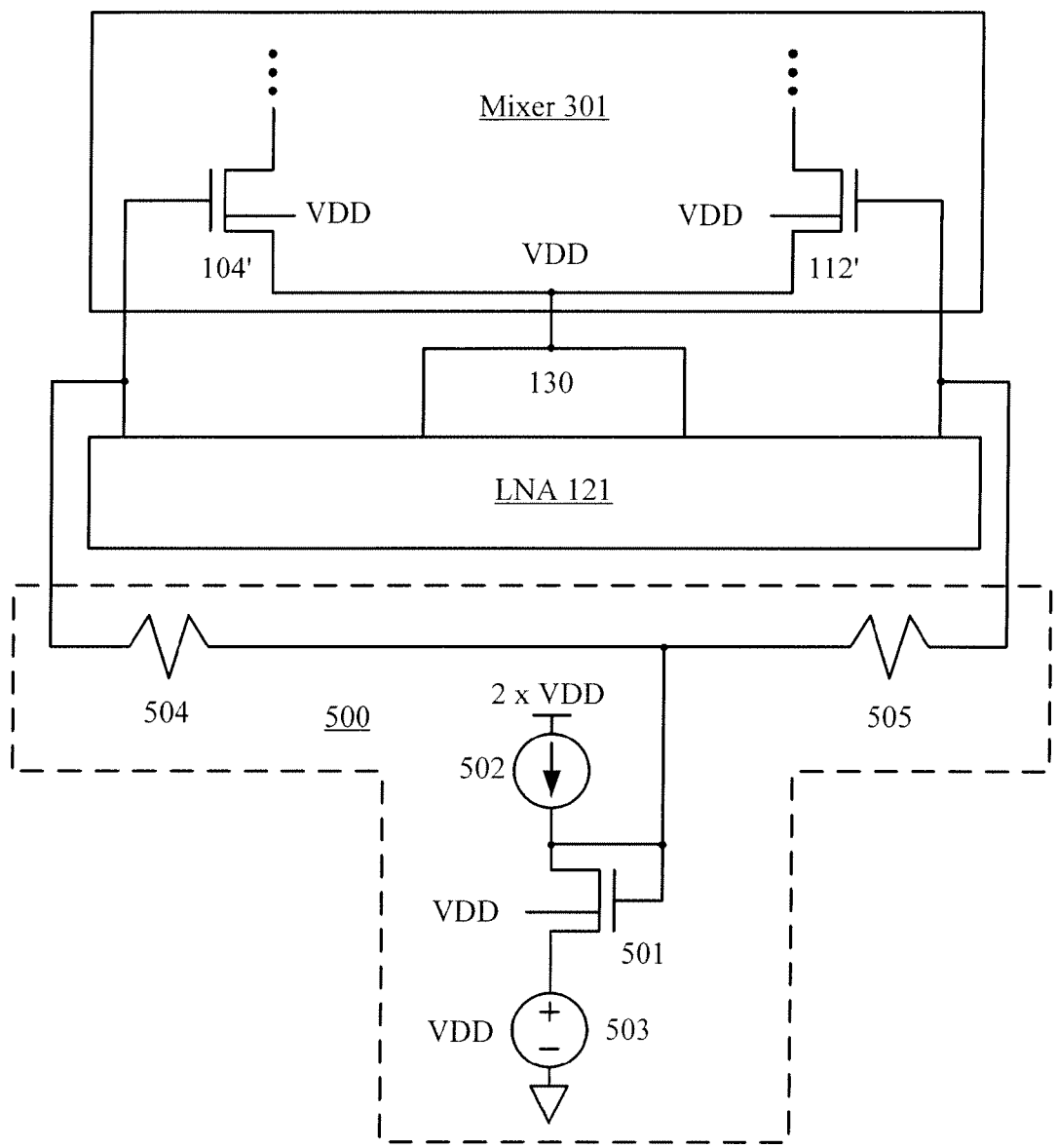
FIG. 5 illustrates an exemplary bias circuit to ensure that VDD is provided at a specific node.

For example, referring to FIG. 5, the gates of transistors 104' and 112' of mixer 301 (other devices not shown in FIG. 5 for simplicity) may be biased to ensure that VDD is provided at node 130. In this embodiment, a circuit 500 may provide this biasing. Circuit 500 may include an NMOS transistor 501 that has its gate and drain connected to the gates of transistors 104' and 112' via resistors 504 and 505, respectively. The drain of transistor 501 is connected to the higher voltage source, e.g. 2×VDD, via a current source 502. The source of transistor 501 is connected to ground via a voltage source 503, which provides VDD. In this embodiment, at-risk transistor 501 must also be formed in a deep n-well and must have its bulk node connected to the same voltage to which the bulk nodes of transistors 104' and 112' are connected, e.g. VDD.

Accordingly, it is intended that the scope of the invention be defined by the following Claims and their equivalents

The invention claimed is:

1. An integrated circuit design configuration including a plurality of stacked devices, the design configuration comprising:
   a subset of the plurality of stacked devices being designated as formed in a deep n-well, thereby allowing the subset of the plurality of stacked devices to receive an increased supply voltage; and
   a remainder of the plurality of stacked devices being designated as formed in a standard n-well, thereby allowing the remainder of the plurality of stacked devices to receive a standard supply voltage, which is less than the increased supply voltage.

2. An integrated circuit design configuration including a plurality of stacked devices, the design configuration comprising:
   a subset of the plurality of stacked devices being designated as formed in a deep n-well, thereby allowing the subset of the plurality of stacked devices to receive an increased supply voltage; and
   a remainder of the plurality of stacked devices being designated as formed in a standard n-well, thereby allowing the remainder of the plurality of stacked devices to receive a standard supply voltage, which is less than the increased supply voltage,
   wherein the subset of the plurality of stacked devices are provided in a first path of a direct conversion receiver, wherein the remainder of the plurality of stacked devices are provided in a second path of the direct conversion receiver, and wherein the first path is one of an I-path and a Q-path and the second path is the other of the I-path and the Q-path.

3. The integrated circuit design configuration of claim 2, wherein the standard supply voltage is VDD and the increased supply voltage is 2×VDD.

4. The integrated circuit design configuration of claim 2, further including a linear regulator connected to a node between the subset of the plurality of stacked devices and the remainder of the plurality of stacked devices.

5. The integrated circuit design configuration of claim 2, further including a set of level shifters provided in a digital portion of the first path.

6. An integrated circuit including a plurality of stacked devices, the integrated circuit comprising:
   a subset of the plurality of stacked devices being formed in a deep n-well, thereby allowing the subset of the plurality of stacked devices to receive an increased supply voltage; and
   a remainder of the plurality of stacked devices being formed in a standard n-well, thereby allowing the remainder of the plurality of stacked devices to receive a standard supply voltage, which is less than the increased supply voltage.

7. An integrated circuit including a plurality of stacked devices, the integrated circuit comprising:
   a subset of the plurality of stacked devices being formed in a deep n-well, thereby allowing the subset of the plurality of stacked devices to receive an increased supply voltage; and a remainder of the plurality of stacked devices being formed in a standard n-well, thereby allowing the remainder of the plurality of stacked devices to receive a standard supply voltage, which is less than the increased supply voltage, wherein the integrated circuit implements a direct conversion receiver, wherein the subset of the plurality of stacked devices are provided in a first path of the direct conversion receiver, wherein the remainder of the plurality of stacked devices are provided in a second path of the direct conversion receiver, and wherein the first path is one of an I-path and a Q-path and the second path is the other of the I-path and the Q-path.

8. The integrated circuit of claim 7, wherein the standard supply voltage is VDD and the increased supply voltage is 2×VDD.

9. The integrated circuit of claim 7, further including a linear regulator connected to a node between the subset of the plurality of stacked devices and the remainder of the plurality of stacked devices.

10. The integrated circuit of claim 7, further including a set of level shifters provided in a digital portion of the first path.

11. A method of designing stacked circuits for an integrated circuit, the method comprising:
    determining a plurality of devices that are stackable;
    designating a subset of the plurality of devices to be formed in a deep n-well, thereby allowing the subset of devices to receive an increased supply voltage; and
    designating a remainder of the plurality of devices to be formed in a standard n-well, thereby allowing the remainder of the plurality of stacked devices to receive a standard supply voltage, which is less than the increased supply voltage.

12. A method of designing stacked circuits for an integrated circuit, the method comprising:
    determining a plurality of devices that are stackable;
    designating a subset of the plurality of devices to be formed in a deep n-well, thereby allowing the subset of devices to receive an increased supply voltage; and
    designating a remainder of the plurality of devices to be formed in a standard n-well, thereby allowing the remainder of the plurality of stacked devices to receive a standard supply voltage, which is less than the increased supply voltage,
    wherein the subset of the plurality of stacked devices are provided for a first path of a direct conversion receiver, wherein the remainder of the plurality of stacked devices are provided for a second path of the direct conversion receiver, and wherein the first path is one of an I-path and a Q-path and the second path is the other of the I-path and the Q-path.

13. The method of claim 12, wherein the standard supply voltage is VDD and the increased supply voltage is 2×VDD.

14. The method of claim 12, further including connecting a linear regulator to a node between the subset of the plurality of stacked devices and the remainder of the plurality of stacked devices.

15. The method of claim 12, further including providing a set of level shifters in a digital portion of the first path.

16. A method of implementing stacked circuits in an integrated circuit, the method comprising:
    identifying a plurality of devices that are stacked;
    forming a subset of the plurality of devices in a deep n-well, thereby allowing the subset of devices to receive an increased supply voltage; and
    forming a remainder of the plurality of devices in a standard n-well, thereby allowing the remainder of the plurality of stacked devices to receive a standard supply voltage, which is less than the increased supply voltage.

17. A method of implementing stacked circuits in an integrated circuit, the method comprising:
    identifying a plurality of devices that are stacked;
    forming a subset of the plurality of devices in a deep n-well, thereby allowing the subset of devices to receive an increased supply voltage; and
    forming a remainder of the plurality of devices in a standard n-well, thereby allowing the remainder of the plurality of stacked devices to receive a standard supply voltage, which is less than the increased supply voltage,
    wherein the integrated circuit implements a direct conversion receiver, wherein the subset of the plurality of stacked devices are provided in a first path of the direct conversion receiver, wherein the remainder of the plurality of stacked devices are provided in a second path of the direct conversion receiver, and wherein the first path is one of an I-path and a Q-path and the second path is the other of the I-path and the Q-path.

18. The method of claim 17, wherein the standard supply voltage is VDD and the increased supply voltage is 2×VDD.

19. The method of claim 17, further including connecting a linear regulator to a node between the subset of the plurality of stacked devices and the remainder of the plurality of stacked devices.

20. The method of claim 17, further including providing a set of level shifters in a digital portion of the first path.

* * * * *